(12) United States Patent
Buynoski et al.

(10) Patent No.: US 8,044,387 B1
(45) Date of Patent: *Oct. 25, 2011

(54) SEMICONDUCTOR DEVICE BUILT ON PLASTIC SUBSTRATE

(75) Inventors: Matthew S. Buynoski, Palo Alto, CA (US); Uzodinma Okoroanyanwu, Mountain View, CA (US); Suzette K. Pangrle, Cupertino, CA (US); Nicholas H. Tripsas, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 1934 days.

This patent is subject to a terminal disclaimer.

(21) Appl. No.: 10/885,959

(22) Filed: Jul. 7, 2004

(51) Int. Cl.
*H01L 35/24* (2006.01)

(52) U.S. Cl. .......... 257/40; 257/759; 257/E39.007

(58) Field of Classification Search ........ 257/40, 257/298, 295, 642–643, 750, 758, 759, 760, 257/98, E39.007
See application file for complete search history.

(56) References Cited

U.S. PATENT DOCUMENTS

| | | | |
|---|---|---|---|
| 4,663,270 A | 5/1987 | Potember et al. | |
| 5,589,692 A | 12/1996 | Reed | |
| 6,055,180 A | 4/2000 | Gudesen et al. | |
| 6,208,553 B1 | 3/2001 | Gryko et al. | |
| 6,212,093 B1 | 4/2001 | Lindsey | |
| 6,272,038 B1 | 8/2001 | Clausen et al. | |
| 6,314,019 B1 | 11/2001 | Kuekes et al. | |
| 6,320,200 B1 | 11/2001 | Reed et al. | |
| 6,324,091 B1 | 11/2001 | Gryko et al. | |
| 6,348,700 B1 | 2/2002 | Ellenbogen et al. | |
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,812,509 B2 * | 11/2004 | Xu | 257/295 |
| 6,924,503 B2 * | 8/2005 | Cheng et al. | 257/40 |
| 2005/0224922 A1 * | 10/2005 | Lyons | 257/642 |

* cited by examiner

*Primary Examiner* — Hoa B Trinh
(74) *Attorney, Agent, or Firm* — Turocy & Watson, LLP

(57) ABSTRACT

Disclosed are semiconductor memory devices containing a plastic substrate and at least one active device supported by the plastic substrate, the active device containing an organic semiconductor material. The semiconductor memory devices containing a plastic substrate may further contain a polymer dielectric and/or a conductive polymer.

20 Claims, 3 Drawing Sheets

SEMICONDUCTOR DEVICE BUILT ON PLASTIC SUBSTRATE

TECHNICAL FIELD

The present invention generally relates to integrated circuit chips with plastic substrates. More particularly, the present invention relates to plastic substrates as supports for semiconductor and/or memory devices.

BACKGROUND ART

Conventional processing techniques used in connection with silicon and silica containing integrated circuit chips often involve high processing temperatures of 600° C. or more. Most conventional integrated circuit chips have a substrate made of glass, quartz, or silicon, which can tolerate relatively high temperature processing. Such high temperatures are required by one or more processing techniques including, for example, silicon re-crystallization, wet oxidation, high temperature chemical vapor deposition, and dopant activation anneals.

There is a continuing trend in the semiconductor industry to shrink components on integrated circuit chips for smaller, faster computing devices. At this time, commercially available integrated circuit chips contain MOSFETs (metal oxide semiconductor field effect transistors) that are microns in width. As the chips and components thereon shrink, it is more important to account for certain physical properties, such as unwanted diffusion, crosstalk, adequate insulation (both electrical and temperature), coefficients of thermal expansion, short channel effects, leakage, critical dimension control, drain induced barrier lowering, and the like, when making circuit designs. Accordingly, new materials, new methods, and new design parameters are required to further this continuing trend.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides memory chips and semiconductor chips where the coefficients of thermal expansion of two or more of the plastic substrate, polymer dielectric, conductive polymers, and organic semiconductors are substantially matched thereby mitigating undesirable effects of temperature changes. Moreover, the present invention provides memory chips and semiconductor chips that are relatively light weight and flexible owing to two or more of plastic substrates, polymer dielectrics, conductive polymers, and organic semiconductors.

One aspect of the present invention relates to semiconductor memory devices containing a plastic substrate and at least one active device supported by the plastic substrate, the active device. The active device may contain an organic semiconductor material, a passive layer, and at least two electrodes. The semiconductor memory devices containing a plastic substrate may further contain a polymer dielectric and/or a conductive polymer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

Figure 1:
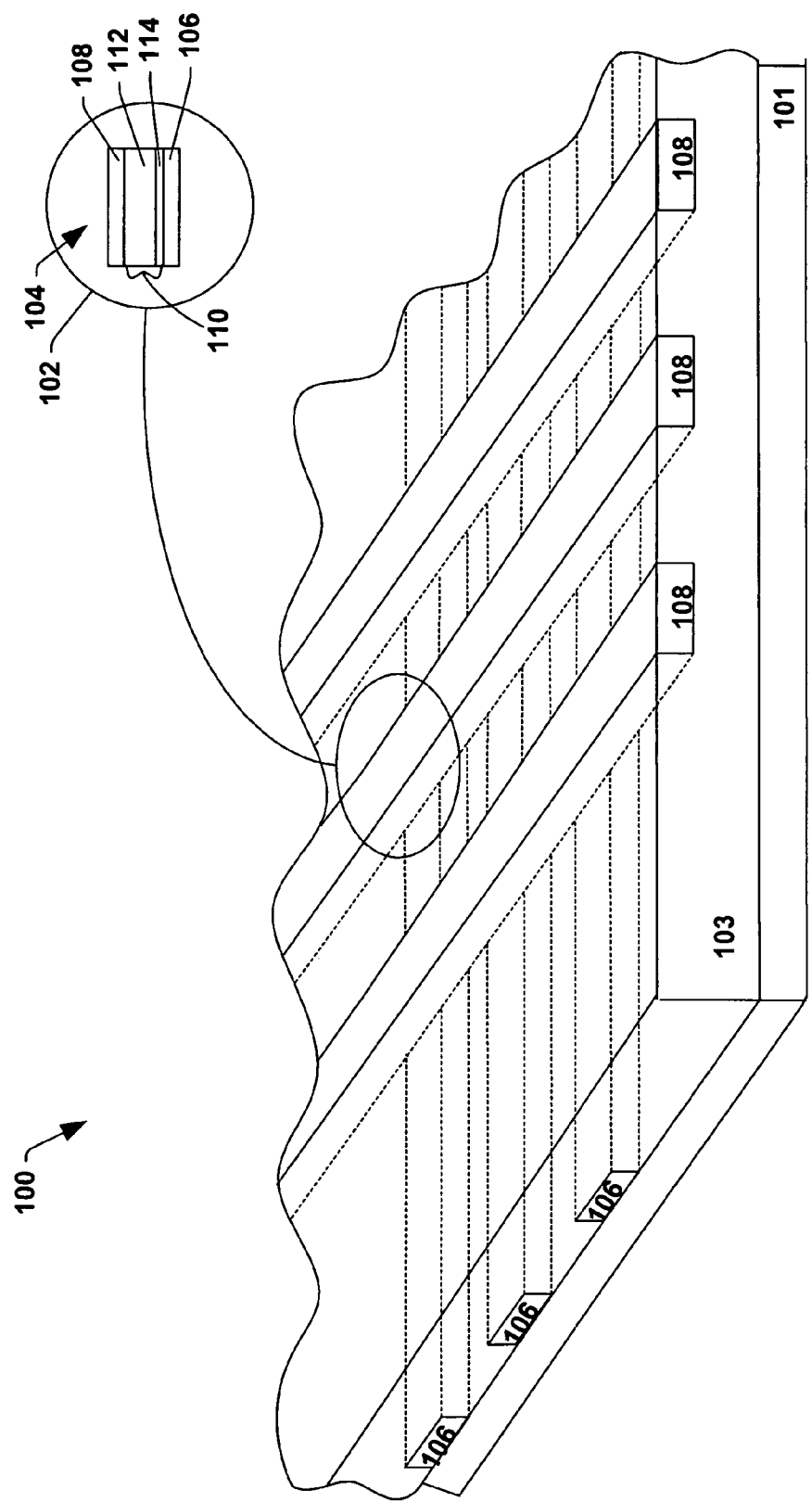
FIG. 1 illustrates a perspective view of a two dimensional microelectronic device containing a plurality of organic memory cells in accordance with one aspect of the invention.

Plastics generally have higher coefficients of thermal expansion than materials commonly employed as semiconductor substrates, such as glass, quartz, and silicon. The coefficient of thermal expansion is generally defined as the fractional increase in length per unit rise in temperature. The present invention involves using plastic substrates to support organic semiconductor or polymer memory devices. The present invention also involves using plastic substrates to support polymer dielectric materials and/or conductive polymers. In this connection, the present invention provides memory chips and semiconductor chips where the coefficients of thermal expansion of two or more of the plastic substrate, polymer dielectric, conductive polymers, and organic semiconductors are substantially matched (much more than when plastic substrates are employed with substantial amounts of inorganic dielectrics, inorganic semiconductor materials, and the like).

The integrated circuit chips made in accordance with the present invention contain a plastic substrate. The plastic substrate has a coefficient of thermal expansion that substantially matches many of the materials that formed over the substrate including insulating films and active devices, particularly active devices made of organic semiconductor or polymer memory cells. Since the substrate is made of plastic, changes in temperature do not deleteriously affect the performance, reliability, and/or mechanical integrity of the integrated circuit chips.

Examples of materials that a plastic substrate contains include one or more of polyesters, polyimides, polycarbonates, polyarylates, polyolefins, polysulfones, polyether sulfones (PES), polyacrylates, polymethacrylates, polymethyl methacrylates (PMMA), polyvinylene chloride (PVC), fluoronated polymers, and the like. Specific examples of materials that a plastic substrate contains include KAPTON® polyimides and IMIDEX® polyimides available from DuPont; polyethylene terephthalate; polybutylene terphthalate; polyethylene; polypropylene; ARDEL® polyacrylate available from Westlake Platics Company; KYNAR® PVDF (polyvinylidene fluoride); TEFZEL® ethylene-tetrafluoroethylene; HALAR® ethylene-chlorotrifluoroethylene; KYNAR® polyvinylidene fluorides; ULTEM® polyetherimide; ZELUX® polycarbonates; UDEL® polysulfone; RADEL® polyphenylsulfone; RADEL® polyethersulfone; and MYLAR® polyester and MELINEX® polyester available from DuPont Teijin Films.

The coefficient of thermal expansion of ARDEL® polyacrylate is $6.1 \times 10^{-5}$ in/in/° F., IMIDEX® polyimide is $3.1 \times 10^{-5}$ in/in/° F., KAPTON® HN polyimide $1.1 \times 10^{-5}$ in/in/° F., ZELUX® polycarbonate is $3.9 \times 10^{-5}$ in/in/° F., UDEL® polysulfone is $3.1 \times 10^{-5}$ in/in/° F., ULTEM® polyetherimide is $3.1 \times 10^{-5}$ in/in/° F., KYNAR® PVDF is $6.6 \times 10^{-5}$ in/in/° F., polypropylene homopolymer is $6.2 \times 10^{-5}$ in/in/° F., polypropylene copolymer is $6.6 \times 10^{-5}$ in/in/° F. The coefficient of thermal expansion is determined in accordance with ASTM D696.

The plastic substrate has a coefficient of thermal expansion suitable to provide secure and reliable support for one or more active devices thereon as well as polymer dielectrics thereon. In one embodiment, the coefficient of thermal expansion of the plastic substrate is from about $0.1 \times 10^{-5}$ in/in/° F. to about $20 \times 10^{-5}$ in/in/° F. In another embodiment, the coefficient of thermal expansion of the plastic substrate is from about $1 \times 10^{-5}$ in/in/° F. to about $10 \times 10^{-5}$ in/in/° F.

The plastic substrate may optionally further contain fillers such as glass, fiberglass, metal oxides, silicon oxides, mica, clay, and the like, and/or plasticizers such as dialkylphthalates, trialkylphosphates, and the like.

The plastic substrate has a thickness suitable to support one or more active devices thereon. In one embodiment, the thickness of the plastic substrate is from about 25 microns to about 5 mm. In another embodiment, the thickness of the plastic substrate is from about 50 microns to about 2 mm. In yet another embodiment, the thickness of the plastic substrate is from about 100 microns to about 1 mm.

The plastic substrate may be transparent, semi-transparent, or opaque. The plastic substrate has a melting point or glass transition temperature that is sufficient to facilitate processing and fabrication of active semiconductor devices thereon (such as forming organic semiconductor devices thereon and/or forming polymer dielectrics thereon). In one embodiment, the plastic substrate has a melting point and/or glass transition temperature that is about 135° C. or higher and about 425° C. or less. In another embodiment, the plastic substrate has a melting point and/or glass transition temperature that is about 140° C. or higher and about 400° C. or less. In yet another embodiment, the plastic substrate has a melting point and/or glass transition temperature that is about 145° C. or higher and about 300° C. or less.

In some instances, some plastics are susceptible to the undesirable permeation of oxygen and/or moisture. In these instances, an optional moisture and/or oxygen barrier layer may be deposited on the surface of the plastic substrate. The optional barrier layer serves to prevent at least a portion of the moisture and/or oxygen from penetrating into the plastic substrate. Examples of barrier layers include alternative layers of metal/polymer such as aluminum/parylene or alternative inorganic dielectric medium/polymers such as silica/cyclotene to reduce and/or eliminate the diffusion of oxygen and moisture through the plastic substrate. When the alternative layer of metal/polymer is employed, the top or final layer is preferably made of insulating material to prevent any possible shorting.

Examples of active devices of organic semiconductor devices and polymer memory devices include nonvolatile organic memory cells, organic semiconductor transistors, polymer semiconductor transistors, nonvolatile polymer memory cells, programmable organic memory cells, and the like. Generally, these active devices contain an organic semiconductor between two electrodes, or an organic semiconductor surrounded by three electrodes. The integrated circuit chips described herein can be employed with logic devices such as central processing units (CPUs); as volatile memory devices such as DRAM devices, as SRAM devices, and the like; with input/output devices (I/O chips); and as non-volatile memory devices such as EEPROMs, EPROMs, PROMs, and the like.

The organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like.

Specific examples of materials for the electrode include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Invar, Monel®, Inconel®, brass, stainless steel, magnesium-silver alloy, and various other alloys.

In one embodiment, the thickness of each electrode is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

Active devices of organic semiconductor devices and polymer memory devices contain an organic semiconductor and a passive layer, which can constitute a controllably conductive media. The controllably conductive media can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, and resistive state(s) with various levels of resistance (in other words, the controllably conductive media may have a plurality of conductive states).

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more organic semiconductor layers and one or more passive layers. The passive layer contains a conductivity facilitating compound. In one embodiment, the controllably conductive media contains at least one organic semiconductor layer that is adjacent to a passive layer (without any intermediary layers between the organic semiconductor layer and passive layer).

Organic semiconductors have a carbon based structure, often a carbon-hydrogen based structure, which is different from conventional MOSFETs. The organic semiconductor materials are typically characterized in that they have overlapping π orbitals, and/or in that they have at least two stable oxidation states. The organic semiconductor materials are also characterized in that they may assume two or more resonant structures. The overlapping π orbitals contribute to the controllably conductive properties of the controllably conductive media. The amount of charge injected into the organic semiconductor layer also influences the degree of conductivity of the organic semiconductor layer.

In this connection, the organic semiconductor layer, such as a conjugated organic polymer, has the ability to donate and accept charges (holes and/or electrons). Generally, the organic semiconductor or an atom/moiety in the polymer has at least two relatively stable states. The two relatively stable oxidation states permit the organic semiconductor to donate and accept charges and electrically interact with the conductivity facilitating compound. The ability of the organic semiconductor layer to donate and accept charges and electrically interact with the passive layer also depends on the identity of the conductivity facilitating compound.

Organic semiconductors generally include polymers with variable electric conductivity. In one embodiment, the organic semiconductor contains a conjugated organic polymer. In another embodiment, the organic semiconductor contains a conjugated organic polymer with an aromatic group within its repeating unit.

Examples of polymers with variable electrical conductivity include polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitrophenylacetylene; poly(trifluoromethyl)phenylacetylene; poly(trimethylsilyl)pheylacetylene; polydipyrrylmethane; polyindoqiunone; polydihydroxyindole; polytrihydroxyindole; furanepolydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

In one embodiment, the organic semiconductor layer is not doped with a salt. In another embodiment, the organic semiconductor layer is doped with a salt. A salt is an ionic compound having an anion and cation. General examples of salts that can be employed to dope the organic semiconductor layer include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

In one embodiment, the organic semiconductor layer has a thickness of about 0.001 µm or more and about 5 µm or less. In another embodiment, the organic semiconductor layer has a thickness of about 0.01 µm or more and about 2.5 µm or less. In yet another embodiment, the organic semiconductor layer has a thickness of about 0.05 µm or more and about 1 µm or less.

The organic semiconductor layer may be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HD-CVD). During formation or deposition, the organic semiconductor material self assembles between the electrodes. It is not typically necessary to functionalize one or more ends of the organic polymer in order to attach it to an electrode/passive layer.

A covalent bond may be formed between the organic semiconductor material and the passive layer. Alternatively, close contact is required to provide good charge carrier/electron exchange between the organic semiconductor layer and the passive layer. The organic semiconductor layer and the passive layer are electrically coupled in that charge carrier/electron exchange occurs between the two layers. The charge carriers can be electrons, holes, and/or ions.

A passive layer contains at least one conductivity facilitating compound that contributes to the controllably conductive properties of the controllably conductive media. The conductivity facilitating compound has the ability to donate and accept charges via holes, and/or electrons, and/or copper ions. The passive layer thus may transport holes, electrons, and/or ions between an electrode and the organic polymer layer/passive layer interface, facilitate charge/carrier injection into the organic polymer layer, and/or increase the concentration of a charge carrier (ions, holes and/or electrons) in the organic polymer layer. In some instances, the passive layer may store opposite charges thereby providing a balance of charges in the organic memory device as a whole. Storing charges/charge carriers is facilitated by the existence of two relatively stable oxidation states for the conductivity facilitating compound.

The applied external field can reduce the energy barrier between the passive layer and organic layer depending on the field direction. Therefore, enhanced charge injection in the forward direction field in programming operation and also enhanced charge recombination in reversed field in erase operation can be obtained.

The passive layer may in some instances act as a catalyst when forming the organic semiconductor layer, particularly when the organic semiconductor layer contains a conjugated organic polymer. In this connection, the polymer backbone of the conjugated organic polymer may initially form adjacent the passive layer, and grow or assemble away and substantially perpendicular to the passive layer surface. As a result, the polymer backbones of the organic polymers may be self aligned in a direction that traverses the electrodes or in a direction away from the passive layer.

Examples of conductivity facilitating compounds that may constitute the passive layer include one or more of copper sulfide ($Cu_2S$, CuS), copper rich copper sulfide ($Cu_3S$, CuS; $Cu_3S$, $Cu_2S$,), copper oxide (CuO, $Cu_2O$), copper selenide ($Cu_2Se$, CuSe), copper telluride ($Cu_2Te$, CuTe), manganese oxide ($MnO_3$), titanium dioxide ($TiO_2$), indium oxide ($I_3O_4$), silver sulfide ($Ag_2S$, AgS), iron oxide ($Fe_3O_4$), cobalt arsenide ($CoAs_2$), nickel arsenide (NiAs), and the like. The conductivity facilitating compounds do not necessarily dissociate into ions under the strength of the electric field, although ions may move through them. The passive layer may contain two or more subpassive layers, each sublayer containing the same, different, or multiple conductivity facilitating compounds.

The passive layer is grown using oxidation techniques, formed via gas phase reactions, implantation techniques, or deposited on/between electrodes. In one embodiment, the passive layer containing the conductivity facilitating compound has a thickness of about 2 Å or more and about 0.1 µm or less. In another embodiment, the passive layer has a thickness of about 10 Å or more and about 0.01 µm or less. In yet another embodiment, the passive layer has a thickness of about 50 Å or more and about 0.005 µm or less.

Operation of the organic memory devices/cells is facilitated using an external stimuli to achieve a switching effect. The external stimuli include an external electric field and/or light radiation. Under various conditions, the organic memory cell is either conductive (low impedance or "on" state) or non-conductive (high impedance or "off" state).

The organic memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information.

Switching the organic memory cell to the "on" state from the "off" state occurs when an external stimuli such as an applied electric field exceeds a threshold value. The threshold value varies depending upon a number of factors including the identity of the materials that constitute the organic memory cell and the passive layer, the thickness of the various layers, and the like.

Generally speaking, the presence of an external stimuli such as an applied electric field that exceeds a threshold value ("programming" state) permits an applied voltage to write or erase information into/from the organic memory cell and the presence of an external stimuli such as an applied electric field that is less than a threshold value permits an applied voltage to read information from the organic memory cell; whereas external stimuli that do not exceed a threshold value do not write or erase information into/from the organic memory cell.

To write information into the organic memory cell, a voltage or pulse signal that exceeds the threshold is applied. To read information written into the organic memory cell, a voltage or electric field of any polarity is applied. Measuring the impedance determines whether the organic memory cell is in a low impedance state or a high impedance state (and thus whether it is "on" or "off"). To erase information written into the organic memory cell, a negative voltage opposite in polarity to the writing signal, that exceeds a threshold value, is applied.

Referring to FIG. 1, a brief description of a microelectronic organic memory device 100 containing a plurality of organic memory cells positioned on or over a plastic substrate 101 in accordance with one aspect of the invention is shown, as well as an exploded view 102 of an exemplary organic memory cell 104. The microelectronic organic memory device 100 contains a desired number of organic memory cells, as determined by the number of rows, columns, and layers (three dimensional orientation described later) present positioned on a plastic substrate 101. The organic memory cells are formed in a polymer dielectric 103. The first electrodes 106 and the second electrodes 108 are shown in substantially perpendicular orientation, although other orientations are possible to achieve the structure of the exploded view 102. Each organic memory cell 104 contains a first electrode 106 and a second electrode 108 with a controllably conductive media 110 therebetween. The controllably conductive media 110 contains an organic semiconductor layer 112 and passive layer 114. Peripheral circuitry and devices are not shown for brevity.

Polymer dielectrics are insulation materials, such as low k materials (a material with a low dielectric constant). Low k materials provide electrical insulation between various layers, devices, structures, and regions within semiconductor substrates. For purposes of this invention, low k materials have a dielectric constant below about 3. In another embodiment, low k materials have a dielectric constant below about 2.4. In yet another embodiment, low k materials have a dielectric constant below about 1.8. In still yet another embodiment, low k materials have a dielectric constant below about 1.5.

General examples of polymer dielectrics include low k polymers and low k fluoropolymers. Examples of polymer dielectric include polyimides, fluorinated polyimides, polysilsequioxanes such as methyl polysilsequioxanes, butyl polysilsequioxanes, and phenyl polysilsequioxanes, benzocyclobutenes (BCB), fluorinated benzocyclobutene, polyphenylene, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fuorinated poly(arylene ether), poly(p-xylxylenes), fluorinated poly(p-xylxylenes), parylene F, parylene N, parylene C, parylene D, amorphous polytetrafluoroethylene, polyphenylquinoxalines, polymeric photoresist materials, and the like.

Specific examples of a commercially available polymer dielectric include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Zirkon from Shipley; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; and Velox™ PAE-2 from Schumacher.

The plastic substrate devices of the present invention may or may not contain inorganic dielectric materials. Examples of such inorganic dielectric material include silica, silicon nitride, silicon oxynitride, other metal oxides, and the like. In one specific embodiment, the organic semiconductor devices that contain plastic substrates (or are on/in/over plastic substrates) do not contain silica.

Figure 2:
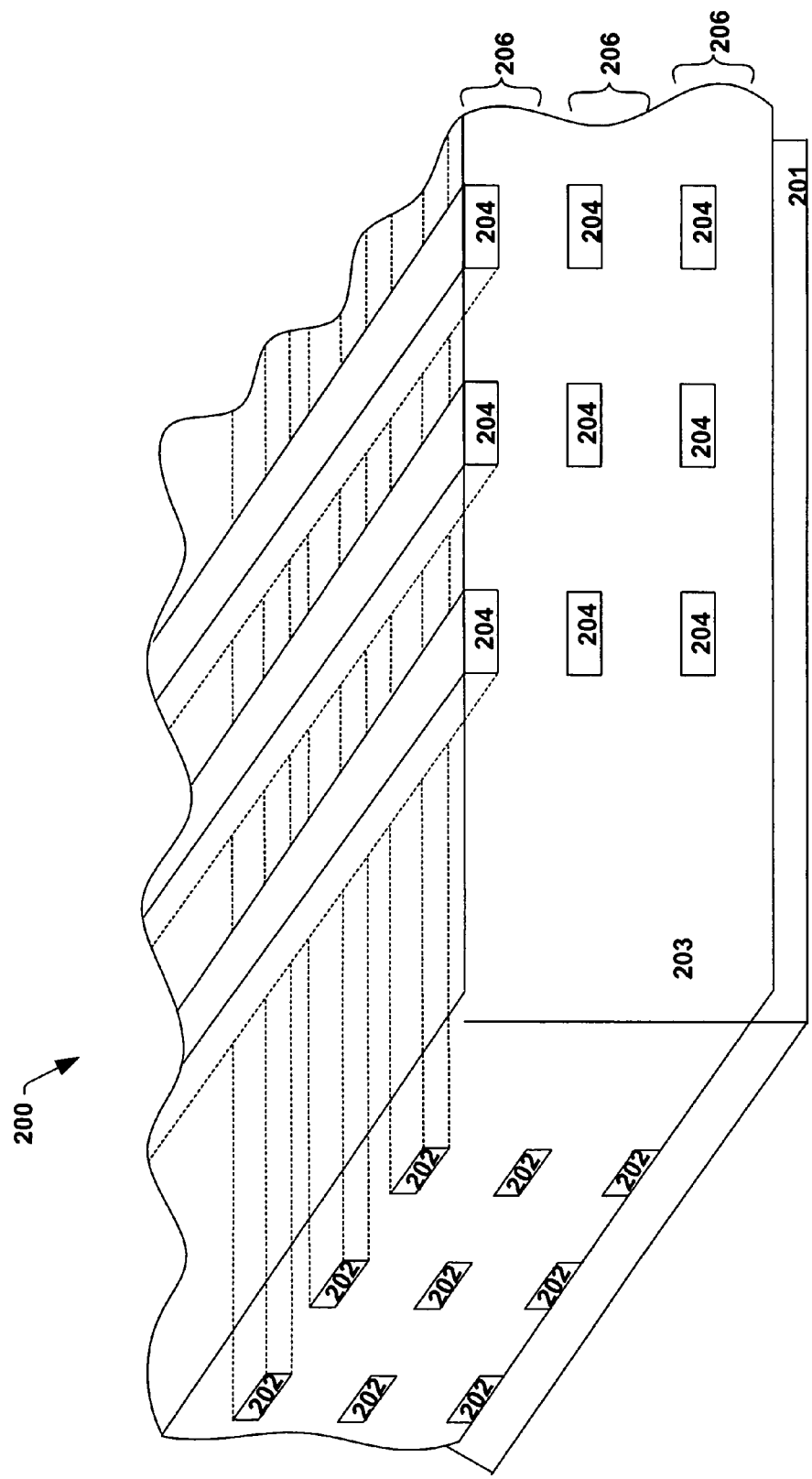
FIG. 2 illustrates a perspective view of a three dimensional microelectronic device containing a plurality of organic memory cells on a plastic substrate in accordance with another aspect of the invention.

Referring to FIG. 2, a three dimensional microelectronic organic memory device 200 containing a plurality of organic semiconductor devices on/over/in a plastic substrate 201 in accordance with an aspect of the invention is shown. The three dimensional microelectronic organic memory device 200 contains a plurality of first electrodes 202, a plurality of second electrodes 204, and a plurality of memory cell layers 206 formed within a polymer dielectric material 203. Between the respective first and second electrodes are the controllably conductive media (not shown). The plurality of first electrodes 202 and the plurality of second electrodes 204 are shown in substantially perpendicular orientation, although other orientations are possible. The microelectronic organic memory device has materials that have relatively matched coefficients of thermal expansion. Peripheral circuitry and devices are not shown for brevity.

Figure 3:
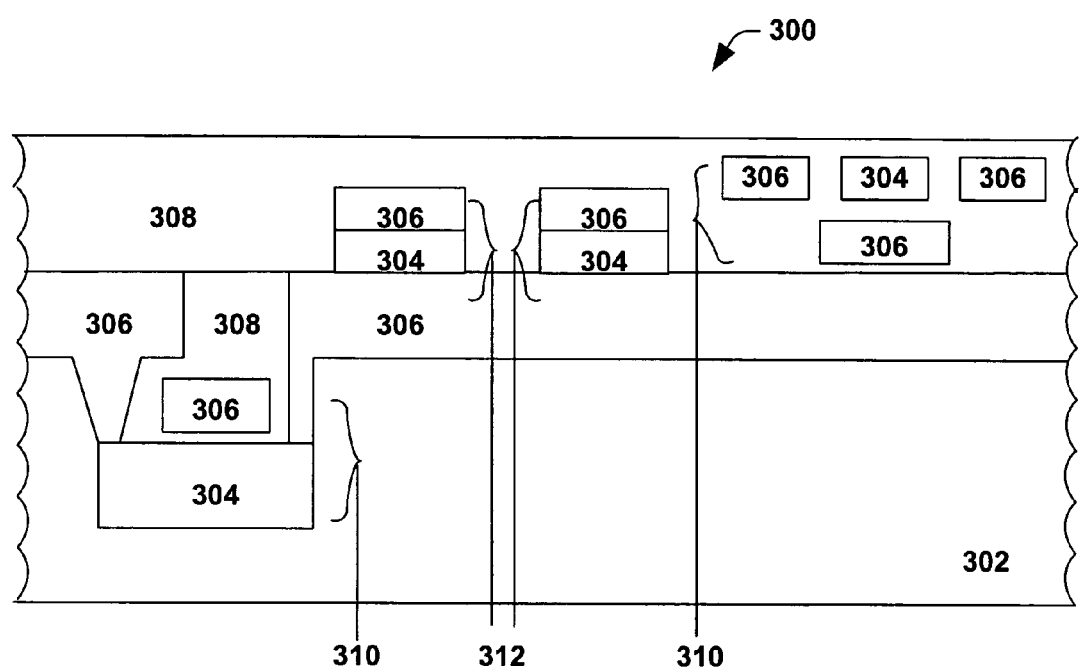
FIG. 3 is a cross sectional illustration of one aspect of an integrated circuit device containing a plurality of organic semiconductor devices on a plastic substrate in accordance with the present invention.

The present invention may be further understood and its advantages further appreciated in conjunction with FIG. 3. A multifunctional semiconductor device 300 is shown with a plastic substrate 302. The multifunctional semiconductor device 300 has, supported on/by the plastic substrate 302, semiconductor structures 304 containing an organic semiconductor and passive layer, conductors 306 containing conductive polymers or metallic materials, and dielectric materials 308 containing polymer dielectrics and/or inorganic dielectric materials. The semiconductor structures 304, conductors 306, and dielectric materials 308 are arranged in such a way so as to form transistors 310 and memory elements 312. When the semiconductor structures 304 contain an organic semiconductor, the conductors 306 contain conductive polymers, and the dielectric materials 308 contain polymer dielectrics, the coefficients of thermal expansion are relatively close enough so that temperature changes do not deleteriously affect the performance of the multifunctional semiconductor device 300.

The organic semiconductor devices with plastic substrates are useful in any device requiring memory. For example, the organic semiconductor devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A semiconductor memory device, comprising:
   a plastic substrate; and
   at least one active device supported by the plastic substrate, the active device comprising a first and a second electrodes with an organic semiconductor material and a passive layer between the first and the second electrodes, the passive layer comprising material selected from a group consisting of copper sulfide, copper rich copper sulfide, copper oxide, copper selenide, copper telluride, manganese oxide, titanium dioxide, indium oxide, silver sulfide, iron oxide, cobalt arsenide, and nickel arsenide.

2. The semiconductor memory device of claim 1, further comprising a polymer dielectric material over the plastic substrate.

3. The semiconductor memory device of claim 2, wherein the polymer dielectric material comprises at least one selected from the group consisting of polyimides, fluorinated polyimides, polysilsequioxanes such as methyl polysilsequioxanes, butyl polysilsequioxanes, and phenyl polysilsequioxanes, benzocyclobutenes, fluorinated benzocyclobutene, polyphenylene, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fluorinated poly(arylene ether), poly(p-xylxylenes), fluorinated poly(p-xylxylenes), parylene F, parylene N, parylene C, parylene D, amorphous polytetrafluoroethylene, polyphenylquinoxalines, and polymeric photoresist materials.

4. The semiconductor memory device of claim 1, wherein the plastic substrate comprises at least one selected from the group consisting of polyesters, polyimides, polycarbonates, polyarylates, polyolefins, polysulfones, polyether sulfones, polyacrylates, polymethacrylates, polymethyl methacrylates, polyvinylene chloride, and fluorolated polymers.

5. The semiconductor memory device of claim 1, wherein the organic semiconductor material comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

6. The semiconductor memory device of claim 1, wherein the passive layer is adjacent to the first electrode and the organic semiconductor material is adjacent to the second electrode.

7. The semiconductor memory device of claim 1, wherein the active device comprises at least one selected from the group consisting of a logic transistor and a nonvolatile memory cell.

8. The semiconductor memory device of claim 1, wherein the plastic substrate has a coefficient of thermal expansion from about $0.1 \times 10^{-5}$ in/in/° F. to about $20 \times 10^{-5}$ in/in/° F.

9. The semiconductor memory device of claim 1, wherein the plastic substrate has a glass transition temperature or a melting point of about 135° C. or higher and about 425° C. or less.

10. A semiconductor memory device, comprising:
    a plastic substrate;
    at least one active device supported by the plastic substrate, the active device comprising a first and a second electrodes with an organic semiconductor material and a passive layer between the first and the second electrodes, the passive layer comprising material selected from a group consisting of copper sulfide, copper rich copper sulfide, copper oxide, copper selenide, copper telluride, manganese oxide, titanium dioxide, indium oxide, silver sulfide, iron oxide, cobalt arsenide, and nickel arsenide; and
    a polymer dielectric material over the plastic substrate.

11. The semiconductor memory device of claim 10, wherein the plastic substrate comprises at least one selected from the group consisting of polyesters, polyimides, polycarbonates, polyarylates, polyolefins, polysulfones, polyether sulfones, polyacrylates, polymethacrylates, polymethyl methacrylates, polyvinylene chloride, and fluorolated polymers.

12. The semiconductor memory device of claim 10, wherein the plastic substrate has a coefficient of thermal expansion from about $1\times10^{-5}$ in/in/° F. to about $10\times10^{-5}$ in/in/° F.

13. The semiconductor memory device of claim 10, wherein the plastic substrate has a glass transition temperature or a melting point of about 140° C. or higher and about 400° C. or less.

14. The semiconductor memory device of claim 10, wherein the polymer dielectric material comprises at least one selected from the group consisting of polyimides, fluorinated polyimides, polysilsequioxanes such as methyl polysilsequioxanes, butyl polysilsequioxanes, and phenyl polysilsequioxanes, benzocyclobutenes, fluorinated benzocyclobutene, polyphenylene, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fluorinated poly(arylene ether), poly(p-xylxylenes), fluorinated poly(p-xylxylenes), parylene F, parylene N, parylene C, parylene D, amorphous polytetrafluoroethylene, polyphenylquinoxalines, and polymeric photoresist materials.

15. The semiconductor memory device of claim 10, wherein the organic semiconductor material comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

16. The semiconductor memory device of claim 10, wherein the passive layer comprises at least one selected from the group consisting of copper sulfide, copper rich copper sulfide, copper oxide, copper selenide, copper telluride, manganese oxide, titanium dioxide, indium oxide, silver sulfide, gold sulfide, iron oxide, cobalt arsenide, and nickel arsenide.

17. A semiconductor memory device, comprising:
a plastic substrate;
at least one active device supported by the plastic substrate, the active device comprising a first and a second electrodes with an organic semiconductor material and a passive layer between the first and the second electrodes, the passive layer comprising material selected from a group consisting of copper sulfide, copper rich copper sulfide, copper oxide, copper selenide, copper telluride, manganese oxide, titanium dioxide, indium oxide, silver sulfide, iron oxide, cobalt arsenide, and nickel arsenide;
a polymer dielectric material over the plastic substrate; and
a conductive polymer adjacent at least one active device.

18. The semiconductor memory device of claim 17, wherein the plastic substrate comprises at least one selected from the group consisting of polyesters, polyimides, polycarbonates, polyarylates, polyolefins, polysulfones, polyether sulfones, polyacrylates, polymethacrylates, polymethyl methacrylates, polyvinylene chloride, and fluorolated polymers.

19. The semiconductor memory device of claim 17, wherein the plastic substrate has a coefficient of thermal expansion from about $0.1\times10^{-5}$ in/in/° F. to about $20\times10^{-5}$ in/in/° F.

20. The semiconductor memory device of claim 17, wherein the plastic substrate has a glass transition temperature or a melting point of about 145° C. or higher and about 300° C. or less.

* * * * *